(12) United States Patent
Huang

(10) Patent No.: US 10,863,622 B2
(45) Date of Patent: Dec. 8, 2020

(54) CIRCUIT BOARD AND ELECTRONIC MODULE WITH AN ELECTRODE STRUCTURE

(71) Applicant: CYNTEC CO., LTD., Hsinchu (TW)

(72) Inventor: Chi-Feng Huang, Taipei (TW)

(73) Assignee: CYNTEC CO., LTD., Hsinchu (TW)

( * ) Notice: Subject to any disclaimer, the term of this patent is extended or adjusted under 35 U.S.C. 154(b) by 0 days.

(21) Appl. No.: 15/970,893

(22) Filed: May 4, 2018

(65) Prior Publication Data

US 2018/0324949 A1    Nov. 8, 2018

Related U.S. Application Data

(60) Provisional application No. 62/501,777, filed on May 5, 2017.

(51) Int. Cl.
| | |
|---|---|
| *H05K 1/11* | (2006.01) |
| *H05K 1/18* | (2006.01) |
| *H05K 3/42* | (2006.01) |
| *H05K 1/14* | (2006.01) |
| *H05K 1/09* | (2006.01) |
| *H05K 3/34* | (2006.01) |
| *H05K 3/40* | (2006.01) |

(52) U.S. Cl.
CPC .............. *H05K 1/117* (2013.01); *H05K 1/09* (2013.01); *H05K 1/115* (2013.01); *H05K 1/14* (2013.01); *H05K 1/141* (2013.01); *H05K 1/185* (2013.01); *H05K 3/423* (2013.01); *H05K 3/3442* (2013.01); *H05K 3/403* (2013.01); *H05K 2201/09009* (2013.01); *H05K 2201/09181* (2013.01); *H05K 2201/1003* (2013.01); *H05K 2201/10378* (2013.01)

(58) Field of Classification Search
CPC ........ H05K 1/117; H05K 1/141; H05K 1/185; H05K 1/14; H05K 3/423; H05K 1/09; H05K 1/115; H05K 3/403; H05K 3/3442
See application file for complete search history.

(56) References Cited

U.S. PATENT DOCUMENTS

| | | | | |
|---|---|---|---|---|
| 4,681,656 | A | * 7/1987 | Byrum ................. | C04B 41/009 156/151 |
| 6,534,726 | B1 | * 3/2003 | Okada ............... | H01L 23/49805 174/260 |

(Continued)

*Primary Examiner* — Nathan Milakovich
(74) *Attorney, Agent, or Firm* — Min-Lee Teng; Litron Patent & Trademark Office

(57) ABSTRACT

An electronic module is disclosed, wherein the electronic module comprises: a first circuit board, comprising a top surface, a bottom surface, and a lateral surface connecting the top surface and the bottom surface of the first circuit board; wherein an electrode structure is disposed on the first circuit board, wherein a second circuit board is disposed under the bottom surface of the first circuit board, wherein a soldering material is disposed between the bottom surface of the electrode structure and the second circuit board and extended onto a wettable flank of the electrode structure to form a soldering structure, wherein said soldering structure comprises an outer surface that is located above the bottom surface of the first circuit board and outside the outmost portion of the lateral surface of the first circuit board.

14 Claims, 5 Drawing Sheets

(56) References Cited

U.S. PATENT DOCUMENTS

| | | | | |
|---|---|---|---|---|
| 6,727,116 B2* | 4/2004 | Poo | ............ | H01L 23/49805 |
| | | | | 257/678 |
| 6,818,977 B2* | 11/2004 | Poo | ............ | H01L 23/13 |
| | | | | 257/685 |
| 7,000,312 B2* | 2/2006 | Fukunabe | ............ | H05K 3/3442 |
| | | | | 174/260 |
| 7,507,914 B2* | 3/2009 | Levine | ............ | H01L 21/485 |
| | | | | 174/260 |
| 9,538,636 B1* | 1/2017 | Weigand | ............ | H05K 1/14 |
| 9,795,034 B2* | 10/2017 | Fujihara | ............ | H01L 33/62 |
| 10,264,664 B1* | 4/2019 | Vinciarelli | ............ | H05K 3/0044 |
| 2006/0203459 A1* | 9/2006 | Morgan | ............ | H05K 3/3436 |
| | | | | 361/768 |
| 2012/0091572 A1* | 4/2012 | Hamaguchi | ............ | H01L 23/055 |
| | | | | 257/676 |
| 2013/0001756 A1* | 1/2013 | Chen | ............ | H01L 23/495 |
| | | | | 257/666 |
| 2015/0282317 A1* | 10/2015 | Gonya | ............ | H05K 3/403 |
| | | | | 174/262 |
| 2018/0177049 A1* | 6/2018 | Vincent | ............ | H05K 1/181 |

* cited by examiner

CIRCUIT BOARD AND ELECTRONIC MODULE WITH AN ELECTRODE STRUCTURE

CROSS-REFERENCE TO RELATED APPLICATION

This application claims the benefit of U.S. provisional patent application No. 62/501,777, filed on May 5, 2017, which is hereby incorporated herein by reference.

BACKGROUND OF THE INVENTION

1. Field of the Invention

The present invention relates to an electronic module, and more particularly, to an electrode structure of the electronic module for connecting with another circuit board.

2. Description of Related Art

When a conventional electronic module needs to connect with a motherboard, a soldering material is used to connect the pads on the bottom surface of the conventional electronic module with the corresponding pads on the top surface of the motherboard, but it is difficult to view the soldering structure between the bottom surface of the conventional electronic module and the corresponding pads on the top surface of the motherboard. As a result, one cannot be sure whether the soldering is complete between said two boards.

Accordingly, a new solution is needed to resolve the above issues.

SUMMARY OF THE INVENTION

One objective of the present invention is to allow an electrode structure of a circuit board having a wettable flank so that the soldering material overlaid on a pad of the circuit board can be extended to a location outside a lateral surface and above the bottom surface of the circuit board for visual checking easily whether the soldering is complete, especially for applications used for vehicle.

One objective of the present invention is to allow an electrode structure of a circuit board having a wettable flank so that the soldering material overlaid on a pad of the circuit board can be extended to a location outside a lateral surface and above the bottom surface of the circuit board through the side wall tinning effect so as to increase the reliability and strength of the soldering structure between different circuit boards, especially for applications used for vehicle.

In one embodiment, an electronic module is disclosed, wherein the electronic module comprises: a first circuit board, comprising a top surface, a bottom surface, and a lateral surface connecting the top surface and the bottom surface; and at least one first electronic device, disposed over the top surface of the first circuit board; wherein an electrode structure is disposed on the first circuit board for electrically connecting with an external circuit, wherein the electrode structure comprises a bottom surface and a side surface, wherein a second circuit board is disposed under the bottom surface of the first circuit board with the bottom surface of the first circuit board facing the top surface of the second circuit board, wherein a soldering material is disposed between the bottom surface of the electrode structure and the top surface of the second circuit board and extended onto said side surface of the electrode structure to form a soldering structure to electrically connect the first circuit board and the second circuit board, wherein said soldering structure comprises an outer surface that is located at a lateral side of the lateral surface of the first circuit board and above the bottom surface of the first circuit board, wherein said outer surface of the soldering structure is located outside the outmost portion of the lateral surface of the first circuit board.

In one embodiment, an opening is formed on the lateral surface of the first circuit board, wherein the electrode structure comprises at least one metal layer disposed on an inner sidewall of the opening, wherein the opening is partially filled by the at least one metal layer, wherein a portion of the soldering structure is disposed inside said opening.

In one embodiment, a through-hole is formed on the lateral surface of the first circuit board, wherein the through-hole is entirely filled with a conductive material, wherein the electrode structure comprises at least one metal layer formed on the bottom surface of the through-hole by an electroplating process.

In one embodiment, the electrode structure comprises a copper layer formed on the bottom surface of the first circuit board by an electroplating process, wherein the thickness of the copper layer is in the range of 50-100 um.

In one embodiment, the first circuit board is a PCB board.

In one embodiment, the second circuit board is a PCB board.

In one embodiment, the first circuit board is a multi-layer circuit board.

In one embodiment, the first circuit board comprises a metallic substrate.

In one embodiment, the first circuit board comprises a ceramic substrate.

In one embodiment, an IC is embedded inside the circuit board.

In one embodiment, an inductor or a choke is disposed over the circuit board.

In one embodiment, an inductor or a choke is disposed over the circuit board and an IC is embedded inside the circuit board.

In one embodiment, a circuit board is disclosed, the circuit board having a top surface, a bottom surface, and a lateral surface connecting the top surface and the bottom surface, wherein an electrode structure is disposed on the circuit board for electrically connecting with an external board, wherein the electrode structure comprises a bottom surface and a side surface, wherein said external board is disposed under the bottom surface of the circuit board with the bottom surface of the circuit board facing the top surface of the external board, wherein a soldering material is disposed between the bottom surface of the electrode structure and the top surface of the external board and extended onto said side surface of the electrode structure to form a soldering structure to electrically connect the circuit board and the external board, wherein said soldering structure comprises an outer surface that is located at a lateral side of said side surface of the electrode structure and above the bottom surface of the circuit board, wherein said outer surface of the soldering structure is located outside the outmost portion of the lateral surface of the circuit board.

In one embodiment, an opening is formed on the lateral surface of the circuit board, wherein the electrode structure comprises at least one metal layer disposed on an inner sidewall of the opening, wherein the opening is partially filled by the at least one metal layer.

In one embodiment, a through-hole is formed on the lateral surface of the circuit board, wherein the through-hole is entirely filled with a conductive material, wherein the electrode structure comprises at least one metal layer formed on the bottom surface of the through-hole by an electroplating process.

In one embodiment, the electrode structure comprises a copper layer formed on the bottom surface of the circuit board by an electroplating process, wherein the thickness of the copper layer is in the range of 50-100 um.

In one embodiment, the circuit board is a PCB board.

In one embodiment, the circuit board is a PCB board.

In one embodiment, the circuit board is a multi-layer circuit board.

In one embodiment, the circuit board comprises a metallic substrate.

In one embodiment, the circuit board comprises a ceramic substrate.

In one embodiment, an IC is embedded inside the circuit board.

The detailed technology and above preferred embodiments implemented for the present invention are described in the following paragraphs accompanying the appended drawings for people skilled in the art to well appreciate the features of the claimed invention.

BRIEF DESCRIPTION OF THE DRAWINGS

The foregoing aspects and many of the accompanying advantages of this invention will become more readily appreciated as the same becomes better understood by reference to the following detailed description when taken in conjunction with the accompanying drawings, wherein.

DETAILED DESCRIPTION OF THE ILLUSTRATED EMBODIMENTS

The detailed explanation of the present invention is described as following. The described preferred embodiments are presented for purposes of illustrations and description and they are not intended to limit the scope of the present invention.

In one embodiment of the present invention, an electronic module is disclosed, wherein the electronic module comprises: a first circuit board, having a top surface, a bottom surface, and a lateral surface connecting the top surface to the bottom surface of the first circuit board; and at least one first electronic device, disposed over the top surface of the first circuit board; and at least one first electronic device, disposed over the top surface of the first circuit board; wherein an electrode structure is disposed on the first circuit board for electrically connecting with an external circuit, wherein the electrode structure 103 comprises a bottom surface and a side surface which acts as a wettable flank on which a soldering material can be soldered thereon, wherein a second circuit board is disposed under the bottom surface of the first circuit board with the bottom surface of the first circuit board facing the top surface of the second circuit board, wherein a soldering material is disposed between the bottom surface of the electrode structure and the top surface of the second circuit board and extended onto said side surface of the electrode structure to form a soldering structure to electrically connect the first circuit board and the second circuit board, wherein said soldering structure comprises an outer surface that is located at a lateral side of said side surface of the electrode structure and above the bottom surface of the first circuit board, wherein said outer surface of the soldering structure is located outside the outmost portion of the lateral surface of the first circuit board.

The following descriptions will illustrate different embodiments of the electrode structure of the electronic module described above.

Figures 1, 1A:
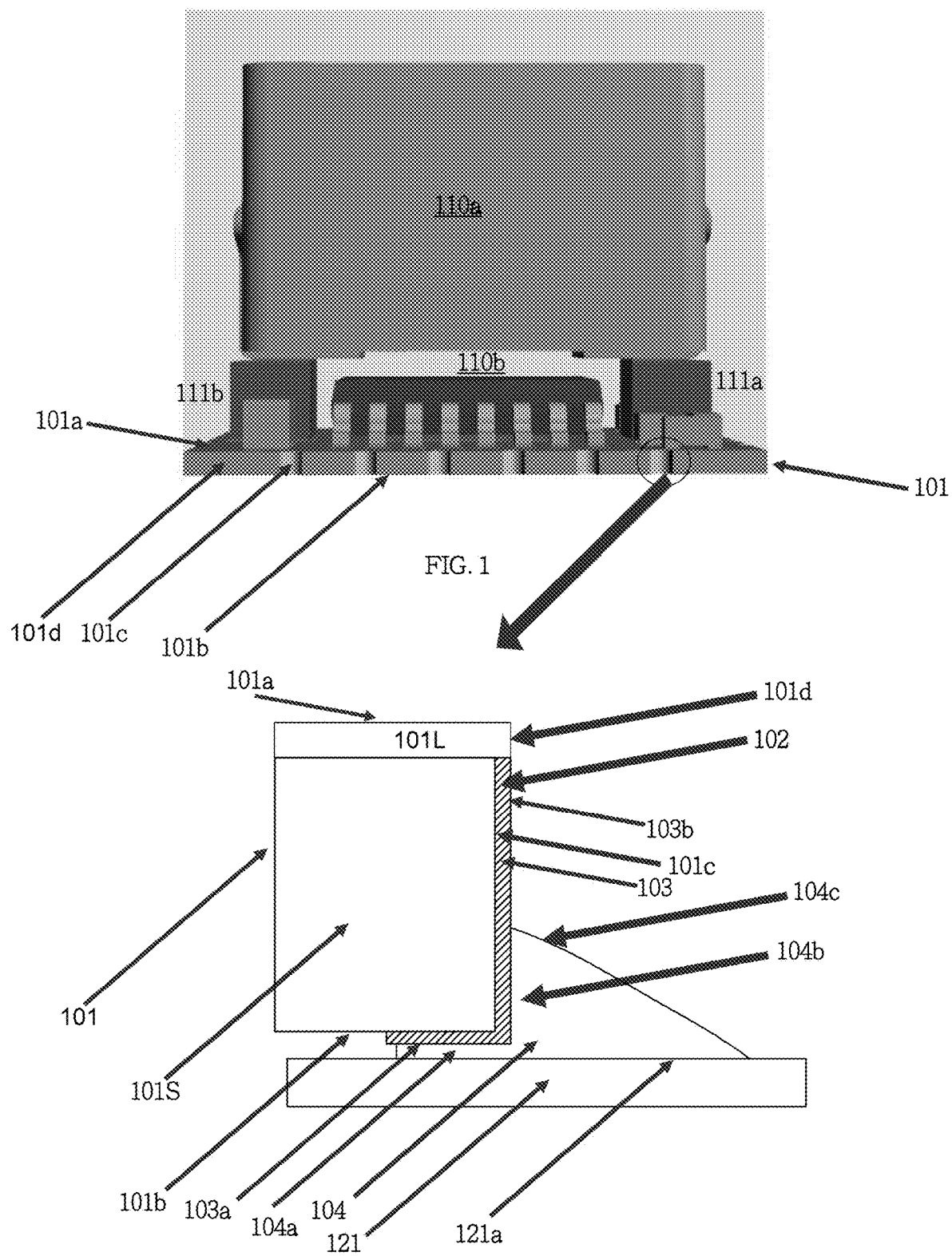
FIG. 1 illustrates a side view of an electronic module in one embodiment of the present invention.
FIG. 1A illustrates an expanded view of an electrode structure with a soldering structure for connecting with an external board.

FIG. 1 illustrates a schematic cross-sectional view of an electronic module in one embodiment of the present invention. FIG. 1A illustrates an expanded view of an electrode structure disposed on a first circuit board with a soldering structure for connecting with an external board.

Please refer to the FIG. 1 and FIG. 1A. The electronic module comprises a first circuit board 101, having a top surface 101a, a bottom surface 101b, and a lateral surface 101c extending from the top surface 101a to the bottom surface 101b of the first circuit board 101, wherein at least one first electronic device 110 is disposed over a top surface 101a of the first circuit board 101, wherein an opening 102 is formed on the lateral surface 101c the first circuit board 101, wherein an electrode structure 103 is disposed on the first circuit board 101 for electrically connecting with an external circuit, wherein the electrode structure 103 comprises a bottom surface 103a and a side surface 103b, which acts as a wettable flank on which a soldering material can be soldered, wherein a first portion of the electrode structure 103 is disposed on the bottom surface 101b of the first circuit board 101 and a second portion of the electrode structure 103 is disposed on an inner sidewall of the opening 102, wherein said inner sidewall of the opening 102 is part of the lateral surface 101c of the first circuit board 101.

As shown in FIG. 1A, a second circuit board 121 is disposed under the bottom surface 101b of the first circuit board 101 with the bottom surface 101b of the first circuit board 101 facing the top surface 121a of the second circuit board 121, wherein a soldering material is disposed between the bottom surface 103a of the electrode structure 103 and the top surface 121a of the second circuit board 121 and extended onto said side surface 103b of the electrode structure 103 to form a soldering structure 104 to electrically connect the first circuit board 101 and the second circuit board 121, wherein said soldering structure 104 comprises an outer surface 104c that is located at a lateral side of said side surface 103b of the electrode structure 103 and above the bottom surface 101b of the first circuit board 101, wherein said outer surface 104c of the soldering structure 104 is located outside the outmost portion 101d of the lateral surface of the first circuit board 101. In one embodiment, the electrode structure 103 has an SMT (surface-mount) PAD, and the top surface has a corresponding SMT (surface-mount) PAD so that the soldering structure 104 is in contact with said pads to electrically connect the first circuit board 101 and the second circuit board 121.

In one embodiment, the first circuit board 101 is a PCB board which comprises a substrate, wherein the opening 102 is a through-hole on a lateral surface of the substrate, wherein the though-hole is partially filled with conductive material, and then, the through-hole will be cut so as to expose the side surface 104b of the soldering structure 104. In one embodiment, the through-hole is plated with copper first, and then nickel and/or gold and other surface treatments can be performed so as to form the soldering structure 104 used for forming the electrode structure 103. The PCB substrate can be used for high density module, which can use copper pillars 111a, 111b to achieve a high density module with stacking capability, as shown in FIG. 1. In one embodiment, after the through-hole is cut, it will have a semi-circular shape, the metal layers on a sidewall of the semi-circular through-hole can be used to achieve sidewall tinning effect so that soldering material can be extended onto the metal layers on the sidewall of the semi-circular through-hole.

Figure 1B:
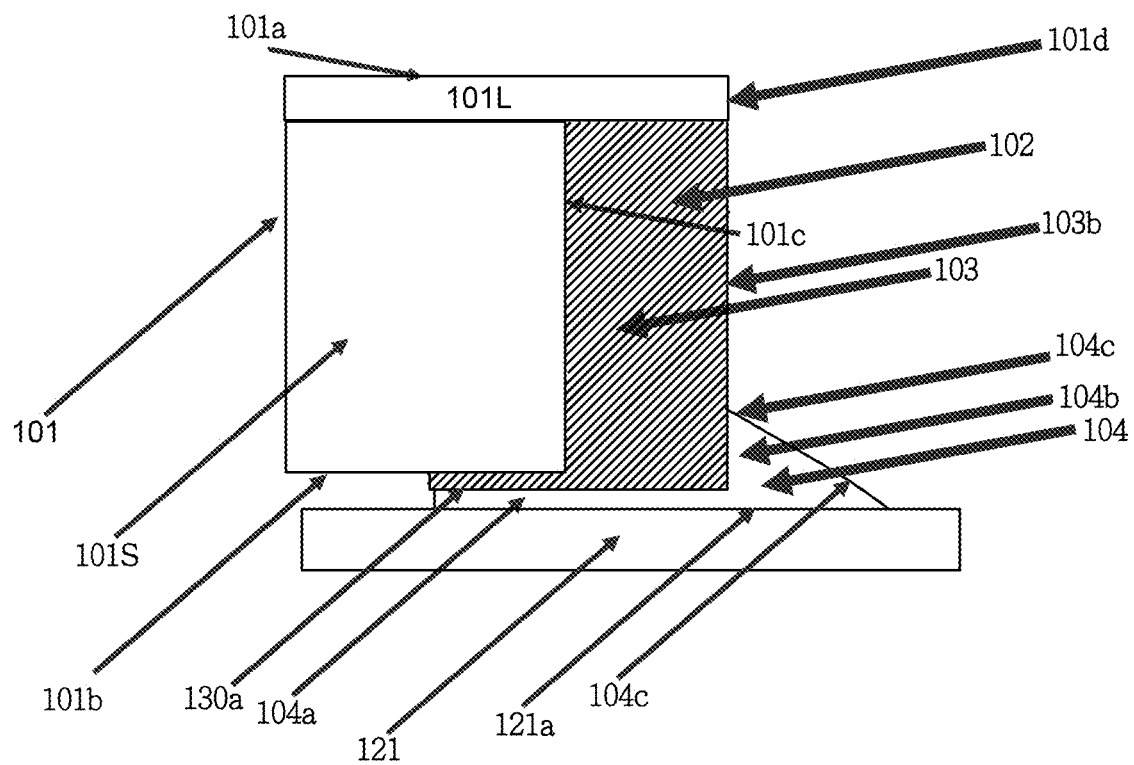
FIG. 1B illustrates an expanded view of an electrode structure with a soldering structure for connecting with an external board.

In another embodiment, FIG. 1B illustrates an expanded view of an electrode structure for connecting with an external board. As shown in FIG. 1B, wherein an electrode structure 103 is disposed on the first circuit board 101 for electrically connecting with an external circuit board, wherein the electrode structure 103 comprises a bottom surface 103a and a side surface 103b, which acts as a wettable flank on which a soldering material can be soldered thereon, wherein at least one portion of the electrode structure 103 occupies the entire opening 102 shown in FIG. 1B, wherein a second circuit board 121 is disposed under the bottom surface 101b of the first circuit board 101 with the bottom surface 101b of the first circuit board 101 facing the top surface 121a of the second circuit board 121, wherein a soldering material is disposed between the bottom surface 103a of the electrode structure 103 and the top surface 121a of the second circuit board 121 and extended onto said side surface 103b of the electrode structure 103 to form a soldering structure 104 to electrically connect the first circuit board 101 and the second circuit board 121, wherein said soldering structure 104 comprises an outer surface 104c that is located at a lateral side of said side surface 103b of the electrode structure 103 and above the bottom surface 101b of the first circuit board 101, wherein said outer surface 104c of the soldering structure 104 is located outside the outmost portion 101d of the lateral surface of the first circuit board 101. In one embodiment, the first circuit board 101 is a PCB board which is used as a substrate, wherein the though-hole is entirely filled with conductive material, and a continuous copper plating is formed on a board edge as a PAD, as shown in FIG. 1B. The PCB substrate can be used for high density module design, in which copper pillars 111a, 111b can be used to achieve a high density module, as shown in FIG. 1. In one embodiment, the electrode structure 103 has an SMT (surface-mount) PAD, and the top surface has a corresponding SMT (surface-mount) PAD so that the soldering structure 104 is in contact with said pads to electrically connect the first circuit board 101 and the second circuit board 121.

Figure 1C:
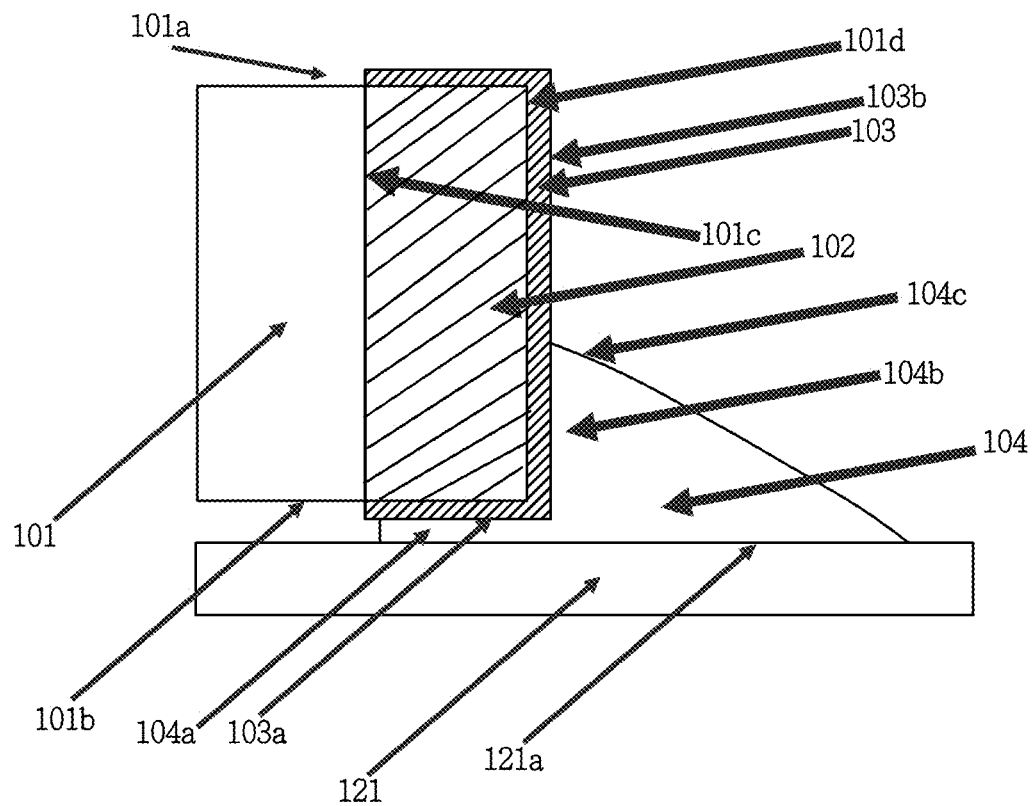
FIG. 1C illustrates an expanded view of an electrode structure with a soldering structure for connecting with an external board.

In another embodiment, FIG. 1C illustrates an expanded view of an electrode structure for connecting with an external board. As shown in FIG. 1C, wherein an electrode structure 103 is disposed on the first circuit board 101, wherein the electrode structure 103 comprises a bottom surface 103a and a side surface 103b, which acts as a wettable flank on which a soldering material can be soldered thereon, wherein the electrode structure 103 extends form top surface 101a to the bottom surface 101b via the lateral surface 101c of the first circuit board 101, wherein a second circuit board 121 is disposed under the bottom surface 101b of the first circuit board 101 with the bottom surface 101b of the first circuit board 101 facing the top surface 121a of the second circuit board 121, wherein a soldering material is disposed between the bottom surface 103a of the electrode structure 103 and the top surface 121a of the second circuit board 121 and extended onto said side surface 103b of the electrode structure 103 to form a soldering structure 104 to electrically connect the first circuit board 101 and the second circuit board 121, wherein said soldering structure 104 comprises an outer surface 104c that is located at a lateral side of said side surface 103b of the electrode structure 103 and above the bottom surface 101b of the first circuit board 101, wherein said outer surface 104c of the soldering structure 104 is located outside the outmost portion 101d of the lateral surface 101 of the first circuit board 101. In one embodiment, the first circuit board 101 is a PCB board which is used as a substrate, wherein a continuous copper plating is formed on a board edge as a PAD, as shown in FIG. 1C. The PCB substrate can be used for high density module design, in which copper pillars 111a, 111b can be used to achieve a high density module, as shown in FIG. 1. In one embodiment, a through-hole 102 is formed on the lateral surface of the first circuit board, wherein the through-hole is entirely filled with a conductive material so that the electrode structure 103 can further comprises the conductive material such as metal disposed in the through-hole 102 in addition to the metal layers on the top and bottom surface of the first circuit board 101. In one embodiment, the electrode structure 103 has an SMT (surface-mount) PAD, and the top surface has a corresponding SMT (surface-mount) PAD so that the soldering structure 104 is in contact with said pads to electrically connect the first circuit board 101 and the second circuit board 121.

Figure 2:
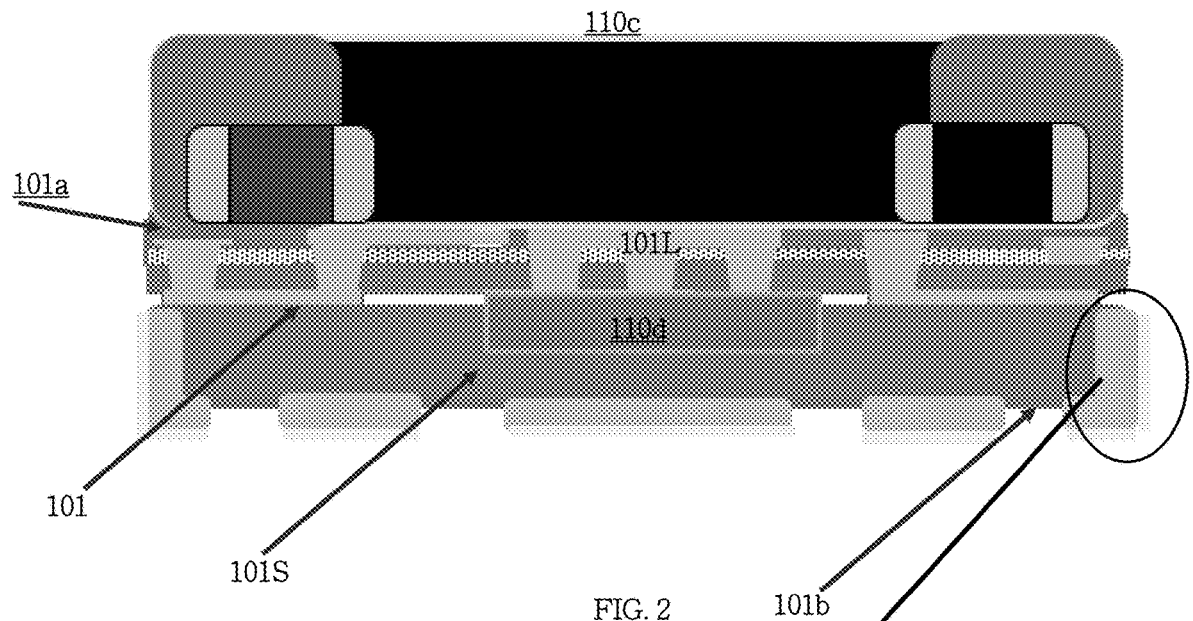
FIG. 2 illustrates a schematic cross-sectional view of an electronic module in one embodiment of the present invention.
Figure 2A:
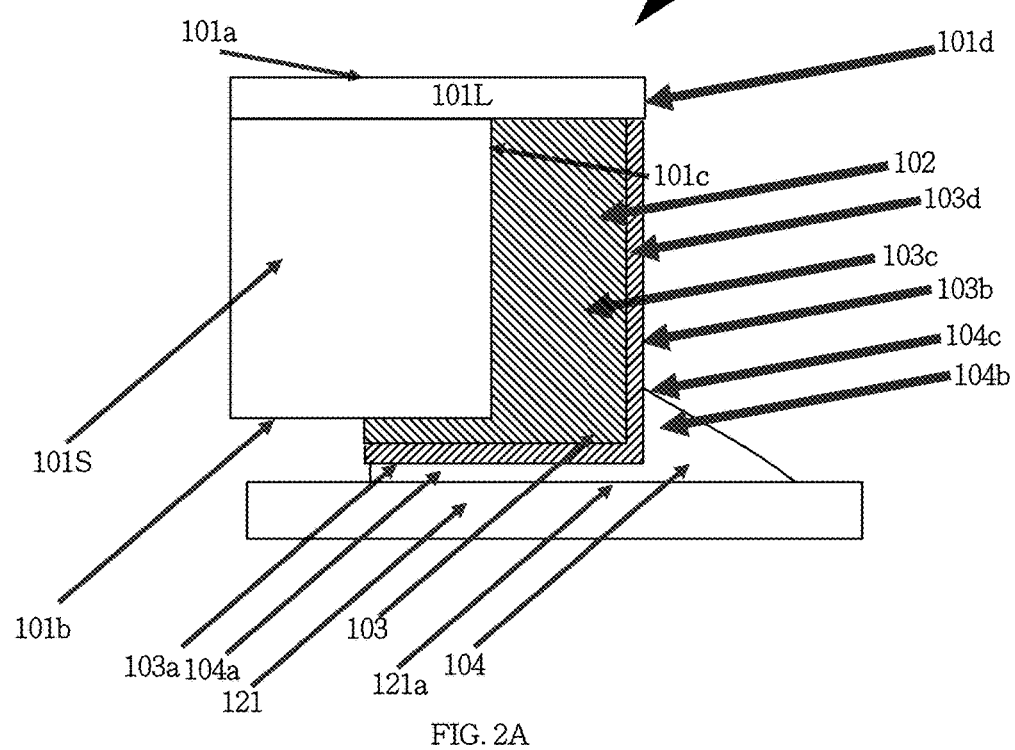
FIG. 2A illustrates an expanded view of an electrode structure with a soldering structure for connecting with an external board.

FIG. 2 illustrates a schematic cross-sectional view of an electronic module in one embodiment of the present invention. FIG. 2A illustrates an expanded view of an electrode structure disposed on a first circuit board 101 with a soldering structure 104 for connecting with an external board. Please refer to the FIG. 2 and FIG. 2A. The electronic module comprises a first circuit board 101, having a top surface 101a, a bottom surface 101b, and a lateral surface 101c extending from the top surface 101a to the bottom surface 101b of the first circuit board, wherein at least one first electronic device 110c, such as an inductor or choke, is disposed over a top surface 101a of the first circuit board 101, wherein an opening 102 is formed on the lateral surface 101c of the first circuit board 101, wherein an electrode structure 103 is disposed in said opening 102 for electrically connecting with an external circuit board, wherein the electrode structure 103 comprises a bottom surface 103a and a side surface 103b, which acts as a wettable flank on which a soldering material can be soldered thereon, as shown in FIG. 2A.

As shown in FIG. 2A, the electrode structure 103 comprises a first metal layer 103c and a second metal layer 103d, wherein said first metal layer 103c can be made of copper and second metal layer 103d comprises tin. As shown in FIG. 2A, a second circuit board 121 is disposed under the bottom surface 101b of the first circuit board 101 with the bottom surface 101b of the first circuit board 101 facing the top surface 121a of the second circuit board 121, wherein a soldering material is disposed between the bottom surface 103a of the electrode structure 103 and the top surface 121a of the second circuit board 121 and extended onto said side surface 103b of the electrode structure 103 to form a soldering structure 104 to electrically connect the first circuit board 101 and the second circuit board 121, wherein said soldering structure 104 comprises an outer surface 104c that is located at a lateral side of said side surface 103b of the electrode structure 103 and above the bottom surface 101b of the first circuit board 101, wherein said outer surface 104c of the soldering structure 104 is located outside the outmost portion 101d of the lateral surface 101c of the first circuit board 101. In one embodiment, an IC 110d can be embedded inside the first circuit board 101, and the first circuit board 101 can be a multi-layer PCB board, wherein the multi-layer PCB board 101 can comprise a substrate 101S and plurality of metal layers and insulating layers 101L disposed over the substrate, wherein the opening 102 can be formed on the periphery of the substrate 101S and the IC 110d can be embedded inside the substrate 101S. In one embodiment, the electrode structure 103 has an SMT (surface-mount) PAD, and the top surface has a corresponding SMT (surface-mount) PAD so that the soldering structure 104 is in contact with said pads to electrically connect the first circuit board 101 and the second circuit board 121.

Figure 3:
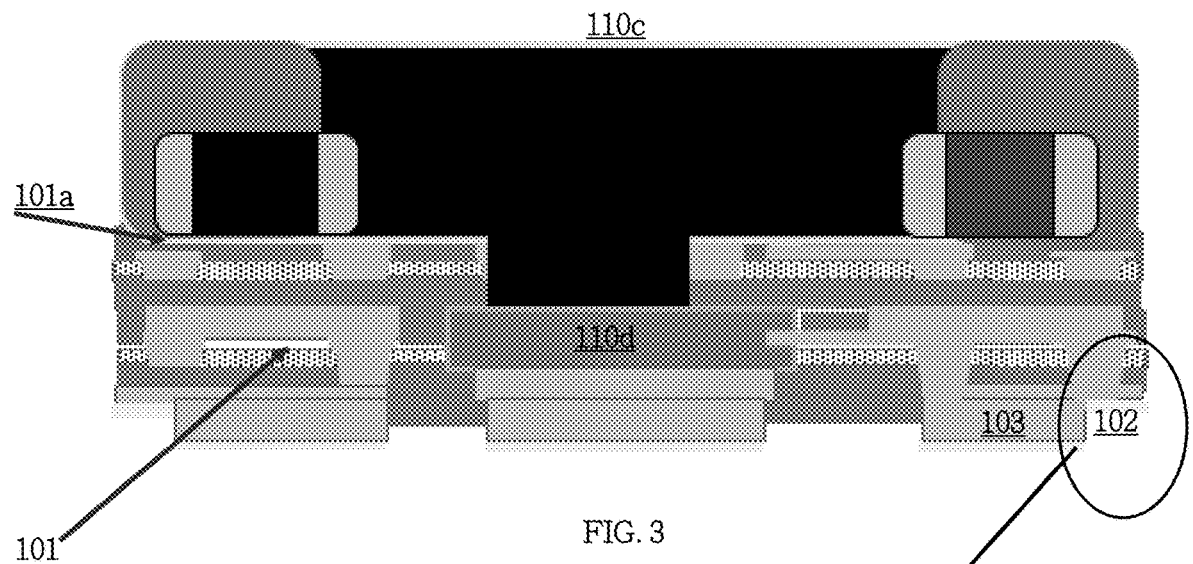
FIG. 3 illustrates a schematic cross-sectional view of an electronic module in one embodiment of the present invention.
Figure 3A:
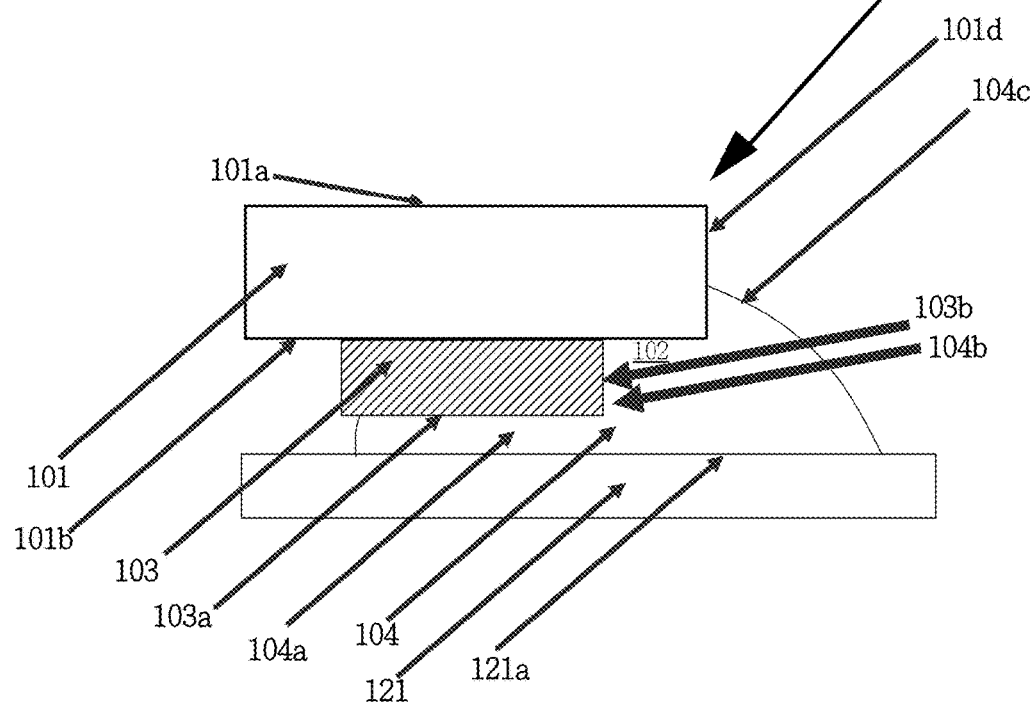
FIG. 3A illustrates an expanded view of an electrode structure with a soldering structure for connecting with an external board.

FIG. 3 illustrates a schematic cross-sectional view of an electronic module in one embodiment of the present invention. FIG. 3A illustrates an expanded view of an electrode structure disposed on a first circuit board 101 with a soldering structure 104 for connecting with an external board. Please refer to the FIG. 3 and FIG. 3A. The electronic module comprises a first circuit board 101, having a top surface 104a, a bottom surface 104b, and a lateral surface 101c extending from the top surface 101a to the bottom surface 101b of the first circuit board 101, wherein at least one first electronic device 110c, such as an inductor or choke, is disposed over a top surface 101a of the first circuit board 101, wherein an electrode structure 103 is formed by forming a metal body on the bottom surface 101b of the first circuit board 101 using an electrode-plating process, wherein the thickness of the metal body of the electrode structure 103 is in the range of 50-100 um, wherein an opening 102 is formed on the lateral surface 101c of the first circuit board 101 for placing a soldering material, wherein the metal body 103 of an electrode structure 103 comprises a bottom surface 103a and a side surface 103b, which acts as a wettable flank on which a soldering material can be soldered thereon, as shown in FIG. 3A.

As shown in FIG. 3A, The electrode structure 103 further comprises a first metal layer 103c and a second metal layer 103d, wherein the first metal layer 103c can be made of copper and the second metal layer 103d comprises tin. A second circuit board 121 is disposed under the bottom surface 101b of the first circuit board 101 with the bottom surface 101b of the first circuit board 101 facing the top surface 121a of the second circuit board 121, wherein a soldering material is disposed between the bottom surface 103a of the electrode structure 103 and the top surface 121a of the second circuit board 121 and extended onto said side surface 103b of the electrode structure 103 to form a soldering structure 104 to electrically connect the first circuit board 101 and the second circuit board 121, wherein said soldering structure 104 comprises an outer surface 104c that is located at a lateral side of said side surface 103b of the electrode structure 103 and above the bottom surface 101b of the first circuit board 101, wherein said outer surface 104c of the soldering structure 104 is located outside the outmost portion 101d of the lateral surface 101c of the first circuit board 101. In one embodiment, the electrode structure 103 has an SMT (surface-mount) PAD, and the top surface has a corresponding SMT (surface-mount) PAD so that the soldering structure 104 is in contact with said pads to electrically connect the first circuit board 101 and the second circuit board 121.

In one embodiment, an IC 110d can be embedded inside the first circuit board 101, and the first circuit board 101 can be a multi-layer PCB board, wherein the multi-layer PCB board 101 can comprise a substrate 101S and plurality of metal layers and insulating layers 101L disposed over the substrate, wherein the opening 102 can be formed on the periphery of the substrate 101S and the IC 110d can be embedded inside the substrate 101S.

Figure 4:
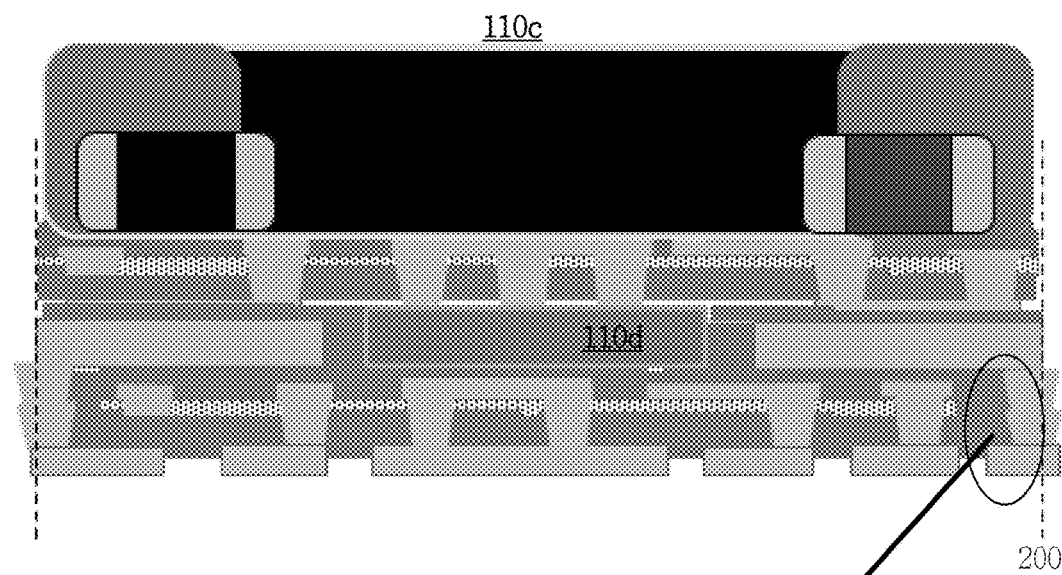
FIG. 4 illustrates a schematic cross-sectional view of an electronic module in one embodiment of the present invention.
Figure 4A:
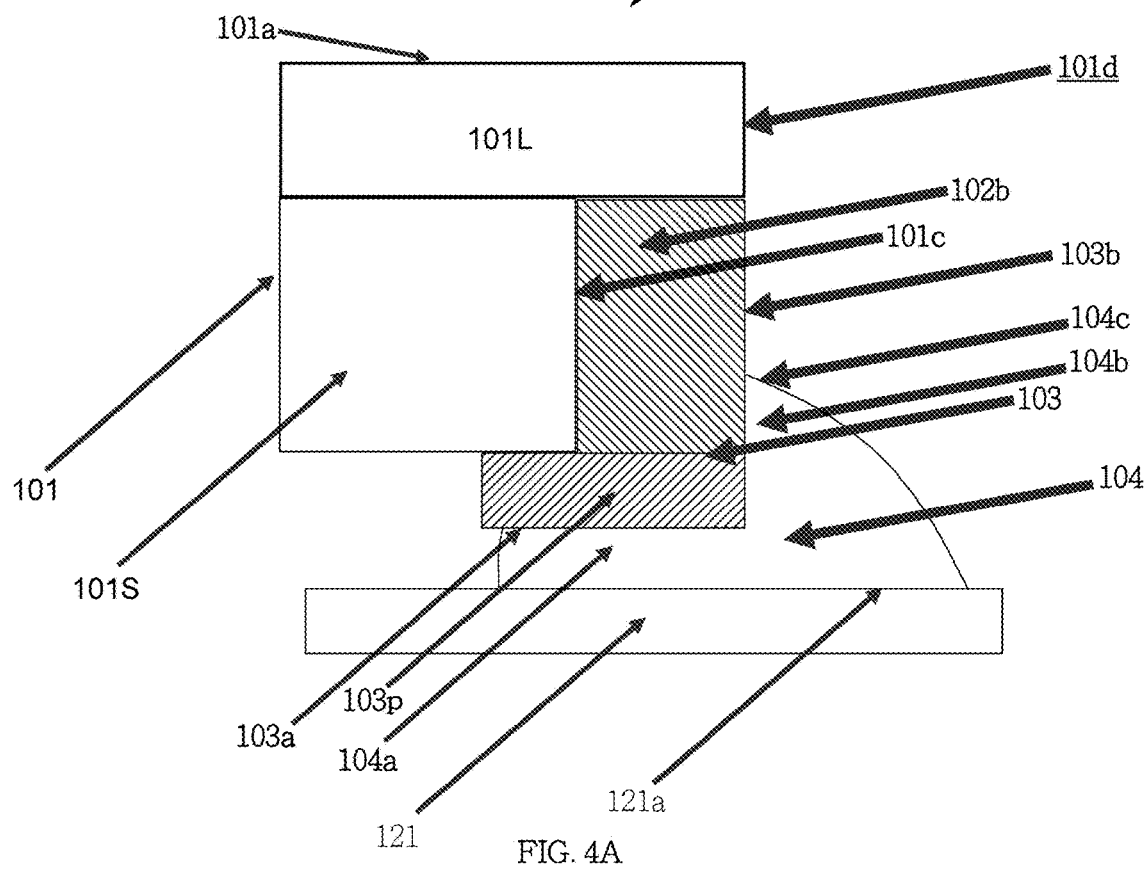
FIG. 4A illustrates an expanded view of an electrode structure with a soldering structure for connecting with an external board.

FIG. 4 illustrates a schematic cross-sectional view of an electronic module in one embodiment of the present invention. FIG. 4A illustrates an expanded view of an electrode structure disposed on a first circuit board 101 with a soldering structure 104 for connecting with an external board. Please refer to the FIG. 4 and FIG. 4A. The electronic module comprises a first circuit board 101, having a top surface 101a, a bottom surface 101b, and a lateral surface 101c extending from the top surface 101a to the bottom surface 101b of the first circuit board 101, wherein at least one first electronic device 110c, such as an inductor or choke, is disposed over a top surface 101a of the first circuit board 101, wherein a via 102b is formed on the lateral surface 101c of the first circuit board 101, wherein the edge of the first circuit board 101 is cut 200 so that the conductive pattern in the via can be exposed so as to form an electrode structure 103 of first circuit board 101.

As shown in FIG. 4A, a conductive material is disposed in said via 102b and a pad 103p is on the bottom surface of the via 102b so that an electrode structure 103 can be formed by the via 102b and the pad 103p, for electrically connecting with an external circuit board, wherein the electrode structure 103 comprises a bottom surface 103a and a side surface 103b, which acts as a wettable flank on which a soldering material can be soldered thereon, as shown in FIG. 4A.

As shown in FIG. 4A, a second circuit board 121 is disposed under the bottom surface 101b of the first circuit board 101 with the bottom surface 101b of the first circuit board 101 facing the top surface 121a of the second circuit board 121, wherein a soldering material is disposed between the bottom surface 103a of the electrode structure 103 and the top surface 121a of the second circuit board 121 and extended onto said side surface 103b of the electrode structure 103 to form a soldering structure 104 to electrically connect the first circuit board 101 and the second circuit board 121, wherein said soldering structure 104 comprises an outer surface that is located at a lateral side of said side surface 103b of the electrode structure 103 and above the bottom surface 101b of the first circuit board, wherein said outer surface 104c of the soldering structure 104 is located outside the outmost portion 101d of the lateral surface of the first circuit board. In one embodiment, the electrode structure 103 has an SMT (surface-mount) PAD, and the top surface has a corresponding SMT (surface-mount) PAD so that the soldering structure 104 is in contact with said pads to electrically connect the first circuit board 101 and the second circuit board 121.

In one embodiment, an IC 110d can be embedded inside the first circuit board 101, and the first circuit board 101 can be a multi-layer PCB board, wherein the multi-layer PCB board can comprise a substrate 101S and plurality of metal layers and insulating layers 101L disposed over the substrate, wherein the opening 102 can be formed on the periphery of the substrate 101S and the IC 110d can be embedded inside the substrate 101S.

In one embodiment, the first circuit board comprises and plurality of metal layers and insulating layers, wherein a through-hole is formed on a lateral surface of the first circuit board, wherein a conductive material is disposed in the through-hole to form a metal body in the through-hole so as to form an electrode structure, wherein a soldering material is disposed between the bottom surface of the electrode structure and the top surface of the second circuit board and extended onto said side surface of the electrode structure to form a soldering structure to electrically connect the first circuit board and the second circuit board, wherein said soldering structure comprises an outer surface that is located at a lateral side of said side surface of the electrode structure and above the bottom surface of the first circuit board, wherein said outer surface of the soldering structure is located outside the outmost portion of the lateral surface of the first circuit board.

In one embodiment, the first circuit board is a PCB board.

In one embodiment, the first circuit board is a single-layer PCB board.

In one embodiment, the first circuit board is a multi-layer PCB board.

In one embodiment, the first circuit board has a metallic substrate.

In one embodiment, the first circuit board has a ceramic substrate.

In one embodiment, the electrode structure of the present invention is electrically connected to a conductive pattern of the first circuit board; in one embodiment, the electrode structure is electrically connected to the first electronic device disposed over the first circuit board.

In one embodiment, at least one second electronic device is disposed over the top surface of the second circuit board described above.

The present invention offers many advantages including: (a) the electrode structure having wettable flank so that the soldering structure can be extended to a location that is easy for visual checking whether the soldering is complete, especially for applications used for vehicle; and (b) increase the reliability and strength of the soldering structure between different circuit boards.

The above disclosure is related to the detailed technical contents and inventive features thereof. People skilled in the art may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. An electronic module, comprising:
a first circuit board, comprising a top surface, a bottom surface, and a lateral surface connecting the top surface and the bottom surface, wherein the lateral surface is an outer surface of the first circuit board; and
at least one first electronic device, disposed over the top surface of the first circuit board;
wherein an electrode structure is disposed on the first circuit board for electrically connecting with an external circuit, wherein the electrode structure comprises a bottom surface and a side surface, wherein a second circuit board is disposed under the bottom surface of the first circuit board with the bottom surface of the first circuit board facing a top surface of the second circuit board, wherein a soldering material is disposed between the bottom surface of the electrode structure and the top surface of the second circuit board and extended onto said side surface of the electrode structure to form a unitary soldering structure to electrically connect the first circuit board and the second circuit board, wherein said unitary soldering structure comprises an outer surface that is located at a lateral side of the lateral surface of the first circuit board and above the bottom surface of the first circuit board, wherein at least one portion of said outer surface of the unitary soldering structure is located outside an outermost portion of the lateral surface of the first circuit board, wherein an opening is formed on the lateral surface of the first circuit board, and the electrode structure comprises at least one metal layer disposed in the opening with at least one portion of the at least one metal layer disposed on an inner sidewall of the opening, wherein the at least one metal layer does not fill out the entire opening with a remaining opening left unfilled in said opening, wherein said outer surface of the unitary soldering structure extends from the top surface of the second circuit board to the at least one metal layer, wherein a first portion of the unitary soldering structure is disposed inside the remaining opening and a second portion of the unitary soldering structure is located outside the opening, and a highest point of said first portion of the unitary soldering structure is in contact with the at least one metal layer and located below a top point of an inner sidewall of the remaining opening, wherein said first portion of the unitary soldering structure does not extend to a top surface of the remaining opening.

2. The electronic module according to claim 1, wherein the entire opening is located directly below a portion of the top surface of the first circuit board.

3. The electronic module according to claim 1, wherein the electrode structure comprises a copper layer formed on the bottom surface of the first circuit board by an electroplating process, wherein a thickness of the copper layer is in the range of 50-100 um.

4. The electronic module according to claim 1, wherein the opening is a through-hole formed on the lateral surface of the first circuit board, wherein the at least one metal layer is extended to the top surface and the bottom surface of the first circuit board.

5. The electronic module according to claim 1, wherein said at least one metal layer comprises a copper layer disposed on the inner sidewall of the opening and a tin layer overlaid on the copper layer.

6. The electronic module according to claim 1, wherein the first circuit board comprises a plurality of insulating layers.

7. The electronic module according to claim 1, wherein the first circuit board is a PCB board.

8. The electronic module according to claim 1, wherein an IC is embedded inside the first circuit board.

9. The electronic module according to claim 1, wherein an inductor or choke is disposed over the first circuit board, wherein a first copper pillar and a second copper pillar are disposed between said inductor or choke and the first circuit board.

10. A circuit board, having a top surface, a bottom surface, and a lateral surface connecting the top surface and the bottom surface, wherein the lateral surface is an outer surface of the circuit board, wherein an electrode structure is disposed on the circuit board for electrically connecting with an external board, wherein the electrode structure comprises a bottom surface and a side surface, wherein said external board is disposed under the bottom surface of the circuit board with the bottom surface of the circuit board facing a top surface of the external board, wherein a soldering material is disposed between the bottom surface of the electrode structure and the top surface of the external board and extended onto said side surface of the electrode structure to form a unitary soldering structure to electrically connect the circuit board and the external board, wherein said unitary soldering structure comprises an outer surface that is located at a lateral side of said side surface of the electrode structure and above the bottom surface of the circuit board, wherein at least one portion of said outer surface of the unitary soldering structure is located outside an outermost portion of the lateral surface of the circuit board, wherein an opening is formed on the lateral surface of the circuit board, and the electrode structure comprises at least one metal layer disposed in the opening with at least one portion of the at least one metal layer disposed on an inner sidewall of the opening, wherein the at least one metal layer does not fill out the entire opening with a remaining opening left unfilled in said opening, wherein said outer surface of the unitary soldering structure extends from the top surface of the external board to the at least one metal layer, wherein a first portion of the unitary soldering structure is disposed inside the remaining opening and a second portion of the unitary soldering structure is located outside the opening, and a highest point of said first portion of the unitary soldering structure is in contact with the at least one metal layer and located below a top point of an inner sidewall of the remaining opening, wherein said first portion of the unitary soldering structure does not extend to a top surface of the remaining opening.

11. The circuit board according to claim 10, wherein the entire opening is located directly below a portion of the top surface of the circuit board.

12. The circuit board according to claim 10, wherein the electrode structure comprises a copper layer formed on the bottom surface of the circuit board by an electroplating process, wherein a thickness of the copper layer is in the range of 50-100 um.

13. The circuit board according to claim 10, wherein the opening is a through-hole formed on the lateral surface of the circuit board, wherein the at least one metal layer is extended to the top surface and the bottom surface of the circuit board.

14. The circuit board according to claim 10, wherein said at least one metal layer comprises a copper layer disposed on the inner sidewall of the opening and a tin layer overlaid on the copper layer.

* * * * *